(12) United States Patent
Lee et al.

(10) Patent No.: US 9,099,192 B1
(45) Date of Patent: Aug. 4, 2015

(54) ERASE ALGORITHM FOR FLASH MEMORY

(71) Applicant: Integrated Silicon Solution, Inc., Milpitas, CA (US)

(72) Inventors: Jong Sang Lee, San Jose, CA (US); Hounien Chen, Newark, CA (US); Kyoung Chon Jin, San Ramon, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 22 days.

(21) Appl. No.: 14/154,035

(22) Filed: Jan. 13, 2014

(51) Int. Cl.
*G11C 16/04* (2006.01)
*G11C 16/34* (2006.01)
*G11C 16/08* (2006.01)

(52) U.S. Cl.
CPC ............ *G11C 16/3445* (2013.01); *G11C 16/08* (2013.01)

(58) Field of Classification Search
CPC ........ G11C 16/08; G11C 16/10; G11C 16/16; G11C 16/3454
USPC ............................ 365/185.11, 185.29, 185.22
See application file for complete search history.

(56) References Cited

U.S. PATENT DOCUMENTS

| 5,963,477 A | * | 10/1999 | Hung ..................... 365/185.22 |
| 6,335,882 B1 | * | 1/2002 | Saeki et al. ............. 365/185.29 |
| 2008/0025099 A1 | * | 1/2008 | Li et al. .................... 365/185.18 |

* cited by examiner

*Primary Examiner* — Huan Hoang
(74) *Attorney, Agent, or Firm* — Van Pelt, Yi & James LLP

(57) ABSTRACT

A non-volatile memory device includes a sector pass/fail indicator circuit configured to store a pass/fail indicator for each sector in a first block of memory cells. The pass/fail indicator has a first value indicating the respective sector has failed erase verification and has a second value indicating the respective sector has passed erase verification. The sector pass/fail indicator circuit set the respective pass/fail indicators to the second value for one or more sectors in the first block after the respective sectors pass erase verification following a previous block erase operation of the first block. The first block is subjected to subsequent block erase operation where only word lines associated with the sectors having a pass/fail indicator having the first value are biased to the first bias voltage level.

12 Claims, 6 Drawing Sheets

ERASE ALGORITHM FOR FLASH MEMORY

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block or a sector of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current and erase and programming cycles can be slow.

Flash memory cells can be programmed individually but are usually erased as a block or a sector. Over the course of the flash memory operation, some sectors may experience more program/erase cycles than other sectors. As a result, different erase speed develops between sectors having different number of program/erase cycles. The difference in erase times between sectors of the flash memory cells can cause over-erase problem when performing block erase.

BRIEF DESCRIPTION OF THE DRAWINGS

Various embodiments of the invention are disclosed in the following detailed description and the accompanying drawings.

FIG. 2, which includes

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a method for performing block erase in a flash memory device prevents over-erase problem in the flash memory when the sectors in a block of memory cells have different erase speed due to different program/erase cycle stress experienced by each sector in the block. When the sectors are subjected to different number of program/erase cycles, each sector develops a different erase time. Block erase of sectors having a large variation in erase speed can lead to over-erase problem. The method of the present invention implements block erase in a flash memory device by storing a sector pass indicator for a sector address when the sector passes erase verification. Subsequent erase bias is applied only to those sectors that fail the erase verification. Sectors that passed erase verification are not subjected to the erase bias again, thereby preventing over-erase of the memory cells.

Figure 1:
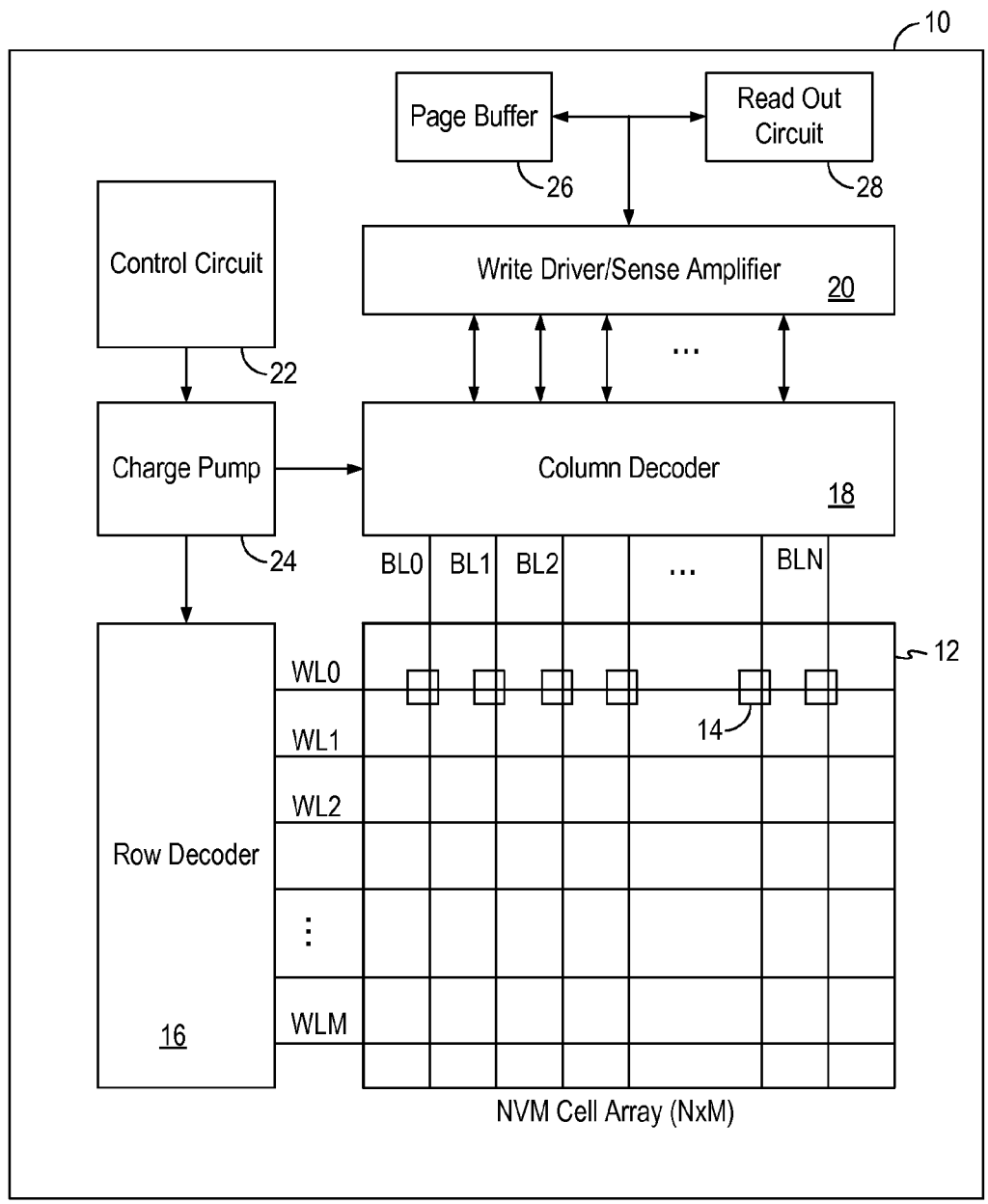
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The cell array 12 is addressed by a row decoder 16 and a column decoder 18 to allow a control circuit 22 to selectively access the memory cells 14 for read, program (write) and erase operations. In particular, the flash memory cells 14 in the array 12 are accessed by word lines WL0 to WLM and bit lines BL0 and BLN. The row decoder 14 selectively activates a word line from WL0 to WLM and the column decoder selectively activates a bit line from BL0 to BLN to allow a memory cell 14 at the intersection of the selected word line and selected bit line to be accessed. A charge pump 24 is used to provide the appropriate voltage and current required for the erase and write operations of the NVM cell array 12. A write driver and sense amplifier circuit 20 is used to write data to or read data from the NVM cell array 12. In practice, the write driver and sense amplifier circuit 20 includes a bank of write drivers and sense amplifiers, one set of write driver and sense amplifier for each input/output (I/O) of the flash memory device. Each set of write driver and sense amplifier is coupled to a block of memory cells 14 in the cell array 12. The write driver and sense amplifier circuit 20 may be coupled to a page buffer 26 to receive program data to be written into the cell array 12 and may be further coupled to a read out circuit 28 to provide data read out from the cell array 12 to external circuits. The memory architecture shown in FIG. 1 is illustrative only and it will be appreciated that the structure and methods described herein may be utilized in other memory architectures.

Figure 2A:
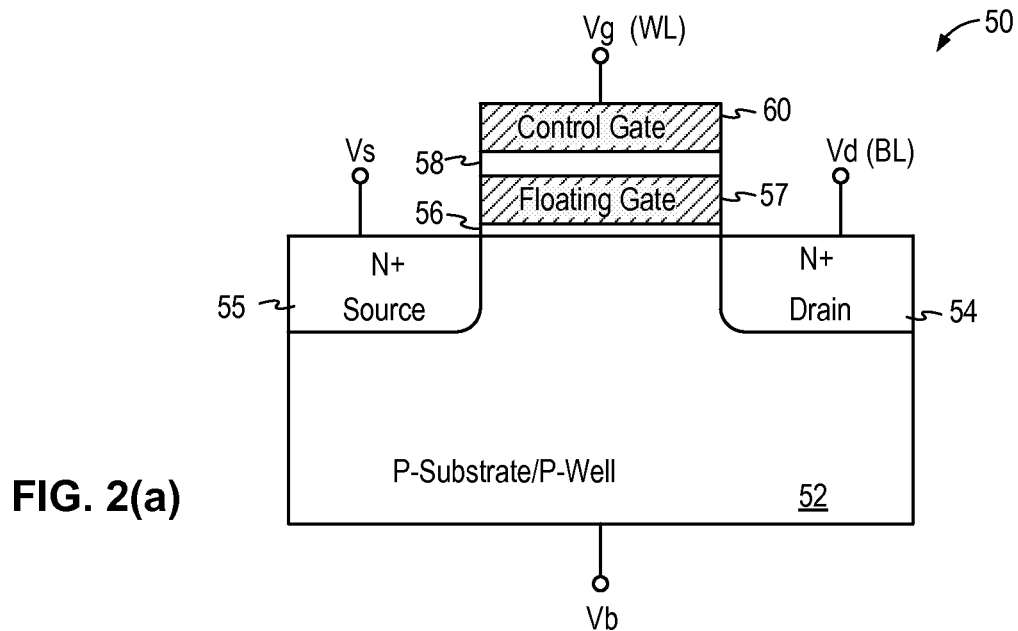
FIG. 2(a) and FIG. 2(b), is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring first to FIG. 2(a), a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically isolated from the P-type well region 52 by a thin gate oxide layer 56 (also referred to as the "tunnel oxide layer") and is electrically isolated from the control gate 60 by another dielectric layer 58 which can be a dielectric film or a stack of different dielectric films. The control gate 60 of the floating gate MOS transistor device 50 is coupled to the word line of the cell array while the drain region is coupled to the bit line of the cell array. In a NOR flash memory, the source regions of the floating gate MOS transistor devices are connected to a shared source line which is typically connected to the ground potential.

The operation of the flash memory device 10 and the floating gate flash memory cell 50 is well known and will be described in brief. In the present example, the flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. Vg=12V) is applied to the control gate to turn on the channel and electrons can flow from the source to the drain. The P-well region 52 is typically grounded. An elevated drain voltage (e.g. Vd=5V) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. Vg=−10V) is applied to the control gate 60 and the substrate is at ground. A positive voltage (e.g. Vd=6V) is applied to the source region 55 with the drain region 54 being grounded or floating. Electrons are pull off the floating gate into the source through quantum tunneling. When the floating gate is left with no charge carriers, the memory cell has a logical state of 1.

Figure 2B:
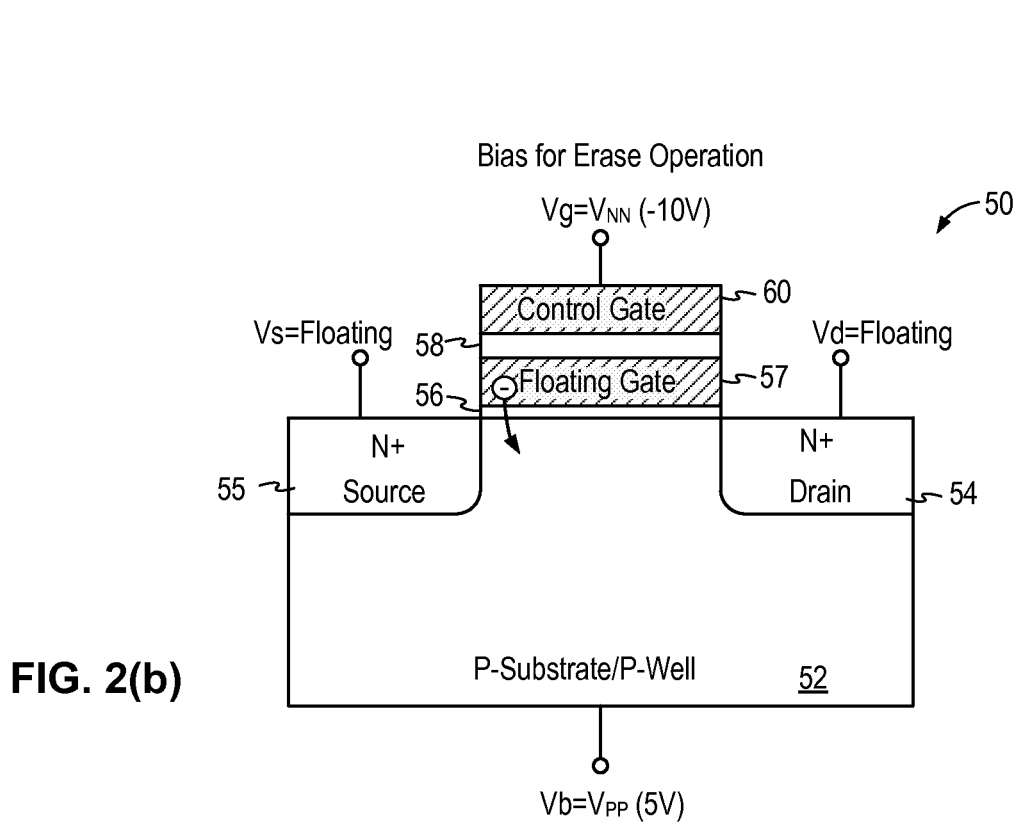

FIG. 2(b) illustrates the biasing condition for performing the channel erase operation. To perform channel erase, an elevated negative voltage (e.g. Vg=−10V) is applied to the control gate 60 and a positive voltage (e.g. Vb=5V) is applied to the semiconductor layer or P-well 52. The source region 55 and the drain region 54 are left floating. Electrons are pull off the floating gate into the substrate through quantum tunneling. When the floating gate is left with no charge carriers, the memory cell has a logical state of 1. In both types of erase operations, the magnitude and the duration of the voltage bias can vary and are selected to insure that all memory cells in a sector a block are erased. In most cases, the flash memory device is erased using a repeated erase-verify operation when the memory cells are verified to be erased after an erase operation and the erase operation is repeated if not all memory cells are erased.

Finally, a flash memory cell is read by applying a gate voltage that is an intermediate threshold voltage of an erased memory cell and a programmed memory cell. When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the cell array 12, an input address is provided to flash memory device 10. The input address is divided into a row address which is coupled to the row decoder 16 and a column address which is coupled to the column decoder 18. Row decoder decodes the row address and activates one word line out of word lines WL0 to WLM and column decoder decodes the column address and activates one bit line out of bit lines BL0 to BLN. In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the conventional flash memory device activates one bit line for each associated write driver/sense amplifier in the flash memory device. In the following description, the operation of the flash memory device will be described with reference to a single write driver/sense amplifier or a single I/O. It is understood that the flash memory device includes a bank of write drivers and sense amplifiers for a set of I/Os, such as a byte of data.

Figure 3:
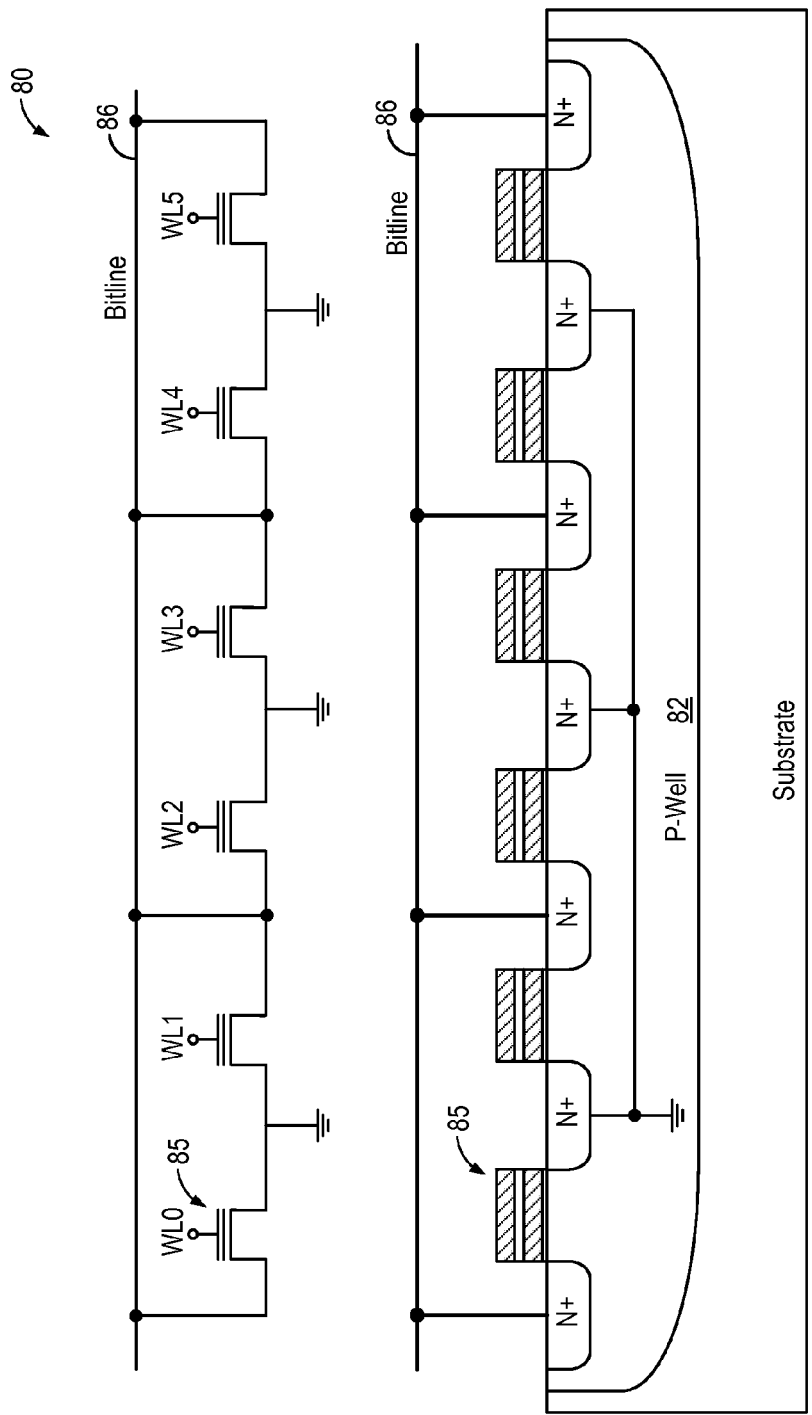
FIG. 3 illustrates an example of a NOR flash memory array.

As described above, the flash memory cells 14 may be configured as a NAND flash memory array or a NOR flash memory array. FIG. 3 illustrates an example of a NOR flash memory array. Referring to FIG. 3, in a NOR array configuration, the floating gate memory cells 85 are connected in parallel with common source regions connected to the ground potential and individual drain regions connected to the bitline 86. In most cases, a section of memory cells in the NOR array is formed in a common P-well 82. Accordingly, biasing of the P-well 82 will be applied to all memory cells in the same well.

Figure 4:
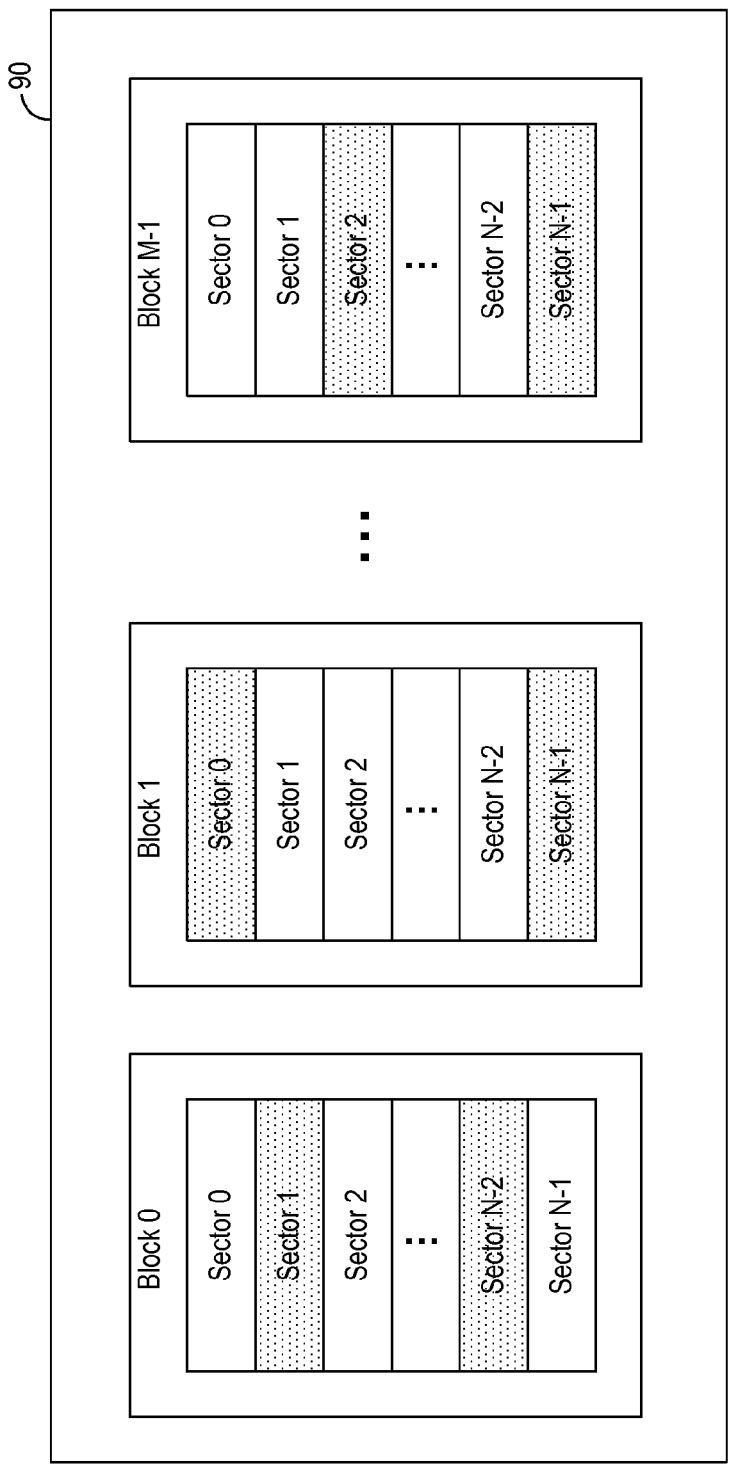
FIG. 4 illustrates a flash memory array in one example configuration.

A flash memory array is typically arranged in multiple blocks with each block containing multiple sectors. FIG. 4 illustrates a flash memory array in one example configuration. Referring to FIG. 4, a flash memory array 90 may be organized into M blocks (Block 0 to Bock M−1) with each block further organized into N sectors (Sector 0 to Sector N−1). In some embodiments, each block of memory cells is formed in a separate P-well. In one example, a block of memory may contain 32 kB with each sector containing 4 kB of memory cells. The flash memory erase operation can be performed using block erase or sector erase. In block erase, each block is erased individually. In sector erase, each sector in a block is erased individually. The memory cells in a selected block or a selected sector are erased all together. When a flash memory device uses sector erase, over the course of operation of the flash memory device, some sectors may be subjected to a greater number of erase cycles than other sectors. Over time, difference erase speeds develop between sectors with fewer numbers of erase cycles and sectors with a larger number of erase cycles. In particular, the erase speed of a heavily cycled sector becomes slower than the erase time of a less frequently cycled sector. Thus, the P/E cycle stressed sectors will take longer to erase than sectors that have experienced lesser amount of P/E cycle stress.

The difference in erase time or erase speed does not affect the sector erase operation as each sector is erased individually. However, when block erase is performed, over-erase problem can result causing leaking in some of the memory cells. In particular, when performing a block erase with sectors having varying erase time, a long erase time may be needed to ensure that memory cells in cycled sectors are erased. However, the less-frequently cycled sectors, needing only a short erase time, may be erased over and over again due to the long erase time needed for the frequently cycled sectors. Some of the memory cells may become over-erased, causing leakage. For example, referring to FIG. 4, in the flash memory array 90, Block 0 includes Sectors 1 and N−2 that are subjected to larger number of erase cycles than the remaining sectors. Block 1 includes Sectors 0 and N−1 that are subjected to larger number of erase cycles. When block erase is applied to Block 0 or Block 1, the other sectors may be subjected to an erase time longer than necessary, causing over-erase problems.

Figure 5:
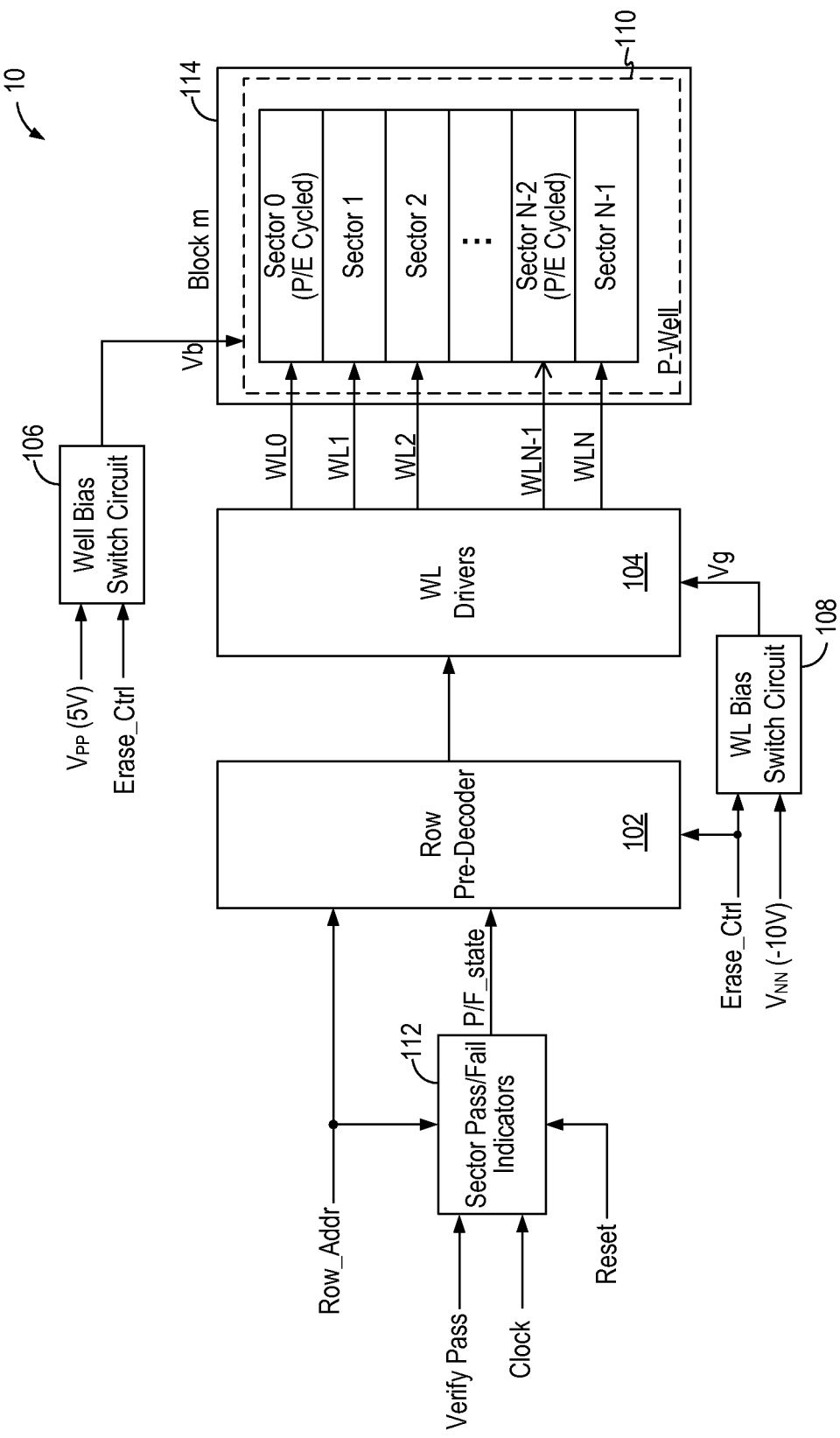
FIG. 5 is a schematic diagram of a portion of the circuitry of the non-volatile memory device of FIG. 1 for performing erase operations in embodiments of the present invention.

In embodiments of the present invention, a non-volatile memory device implements a selective-sector block erase method to prevent over-erase of sectors that require a shorter erase time. FIG. 5 is a schematic diagram of a portion of the circuitry of the non-volatile memory device of FIG. 1 for performing erase operations in embodiments of the present invention. Referring to FIG. 5, the non-volatile memory device 10 (or flash memory device 10) includes a memory array 12 arranged in blocks and sectors. In the present illustration, the memory array is illustrated by a block 114 of memory cells (Block m) with N sectors. The block 114 is formed in a single well region 110, such as a P-well. To perform the erase operation, selected word lines (WL0 to WLN−1) in Block m are biased to a negative voltage $V_{NN}$ and the well region 110 is biased to a positive voltage $V_{PP}$. The bias voltages are typically provided as voltage pulses having a given duration. The word lines are coupled to the control gates of the memory cells and the P-well 110 forms the body or the channel of the memory cells. Memory cells with the control gate biased to the negative voltage $V_{NN}$ and the P-well biased to the positive voltage $V_{PP}$ will be erased.

In flash memory device 10, the desired memory cells for erase operation is selected by the row address Row_Addr which is coupled to a Row Pre-Decoder 102 to be decoded. The decoded address is coupled to a word line driver circuit 104 to activate one or more selected word lines. A word line bias switch circuit 108 provides the desired negative bias voltage $V_{NN}$ to the word line driver circuit 104. In this manner, the selected word lines are biased to the desired negative bias voltage $V_{NN}$ at the word line driver circuit 104. Meanwhile, a well bias switch circuit 106 applies a positive voltage $V_{PP}$ to the well region 110 of the memory array. The word line bias switch circuit 108 and the well bias switch circuit 106 are both operative to generate pulses at the respective voltage levels to the respective circuits. The erase operation in flash memory device 10 is controlled by a erase control signal Erase_Ctrl. The erase control signal Erase_Ctrl is coupled to the row pre-decoder 102, the word line bias switch circuit 108 and the well bias switch circuit 106 to control the erase operation.

More specifically, to perform a sector erase, the row address Row_Addr for the sector (e.g. Sector 1) is provided to the row pre-decoder 102 and selected word lines will be activated. Under the control of the erase control signal Erase_Ctrl, the negative bias voltage $V_{NN}$ is applied to the word lines through the word line driver circuit 104 and the positive bias voltage $V_{PP}$ is applied to the well region 110. Under this bias condition, the memory cells in the selected sector will be erased. Other sectors in the same P-well will not be erased as their word lines are not biased to the negative bias voltage. After the erase operation, an erase verify operation is performed. If some of the memory cells in the sector are still not erased, the sector erase operation will be performed again, sometimes with increased bias voltage or bias pulse duration.

On the other hand, to perform a block erase, the row address Row_Addr for the block (e.g. Block m) is provided to the row pre-decoder 102 and selected word lines will be activated. Under the control of the erase control signal Erase_Ctrl, the negative bias voltage $V_{NN}$ is applied to the word lines through the word line driver circuit 104 and the positive bias voltage $V_{PP}$ is applied to the well region 110. Under this bias condition, the memory cells in the selected block, including all the sectors, will be erased. After the erase operation, an erase verify operation is performed. If some of the memory cells in the block are still not erased, the block erase operation will be performed again, sometimes with increased bias voltage or bias pulse duration. Because some of the sectors in a block may have different erase speed than other sectors due to different amount of erase cycle stress, the repeated block erase operation to all the sectors in a block may result in over-erase of some of the sectors.

In embodiments of the present invention, the flash memory device 10 incorporates a sector pass/fail indicator circuit 112 configured to store the erase verify result for each sector in a block. In some embodiments, a sector pass/fail indicator circuit 112 is provided for each block in the flash memory array to store the erase verify result for each sector in each block of the flash memory device. The sector pass/fail indicator circuit 112 receives the row address Row_Addr, a clock, and also the verify pass result for each sector as input signals. The sector pass/fail indicator circuit 112 stores the erase verify result for each sector in a block. In one embodiment, the sector pass/fail indicator circuit 112 includes a latch designated for each sector as the pass/fail indicator for the sector. The latch is set in response to the verify pass result being affirmative for that sector, that is, all the memory cells in that sector have been verified to be erased. The latch remains unset in response to the verify pass result being negative for that sector, indicating one or more memory cells in the sector still have not been erased. In some embodiments, the sector pass/fail indicator circuit 112 also receives a Reset signal to reset the states of all the pass/fail indicators or latches to an unset mode when an erase operation is initialized.

In operation, the latches in the sector pass/fail indicator circuit 112 are reset at the start of a block erase operation. Then, after a block erase operation is performed, the flash memory device performs erase verification. During the erase verification operation, the sector address and the verify result associated with each sector address are provided to the sector pass/fail indicator circuit 112. When a sector passes verification, the latch or the pass/fail indicator associated with that sector address is set.

In a conventional block erase operation, the block erase operation is repeated when one or more sector fails the erase verification process. That is, each sector is repeatedly erased until all the sectors pass erase verification. The repeated erase operation can lead to over-erasure of some of the memory cells. In embodiments of the present invention, the flash memory device implements a selective-sector block erase method using the pass/fail indicator data stored in the sector pass/fail indicator circuit 112. More specifically, in response to a block address being presented to the row address input, the sector pass/fail indicator circuit 112 provides sector pass/fail status for the sector addresses in the block to the address pre-decoder 102. Using the selective-sector block erase method, during a block erase operation, the address pre-decoder 102 receives the block address Row_Addr and also the pass/fail indicator data associated with the sector addresses in the block. The row pre-decoder 102 activates a word line associated with a sector address only when the sector address has an associated pass/fail indicator value that is unset (fail). When a sector address has an associated pass/fail indicator value that is set (pass), the row pre-decoder 102 does not activate the word line for that sector address which prevents the negative bias voltage $V_{NN}$ from being applied to the control gate of the memory cells in that sector. In this manner, the block erase operation is repeated but the negative bias voltage $V_{NN}$ is applied to the word lines only for sectors that failed erase verification. The sectors that pass erase verification will not receive any negative gate bias and over-erasure is prevented. Meanwhile, the well region 110 receives the positive well bias voltage $V_{PP}$ from the well bias switch circuit 106. Memory cells with the control gate biased to the negative voltage $V_{NN}$ and the P-well biased to the positive voltage $V_{PP}$ will be erased. Memory cells with the control gate not activated or floating will not be erased.

Figure 6:
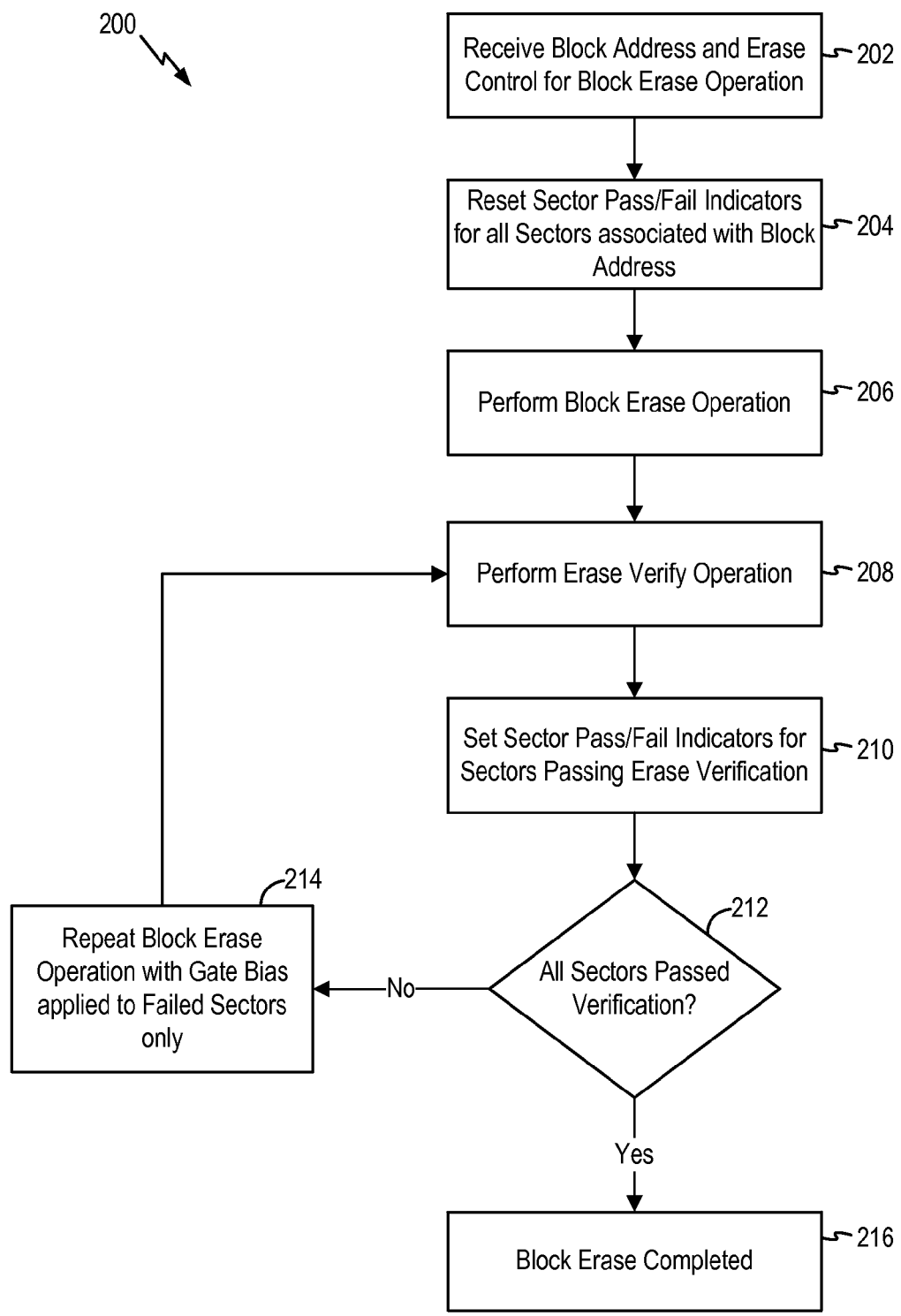
FIG. 6 is a flow chart illustrating a selective-sector block erase method which can be implemented in the flash memory device of FIG. 5 in embodiments of the present invention.

FIG. 6 is a flow chart illustrating a selective-sector block erase method which can be implemented in the flash memory device of FIG. 5 in embodiments of the present invention. Referring to FIG. 6, the selective-sector block erase method 200 starts when an erase control signal and a block address are received indicating a block erase operation to be performed at the block address (202). At 204, the method 200 reset the states of sector pass/fail indicators for all sector associated with the block address. That is, the state of the sector pass/fail indictors for all the sectors in the selected block are reset to the fail state.

At 206, the method 200 performs a block erase operation where all sectors within the block associated with the block address are subjected to the erase operation. At 208, the method 200 performs the erase verify operation to verify that all memory cells in the block have been erased. At 210, the method 200 set the sector pass/fail indicators to the pass state for those sectors that passed erase verification. At 212, the method 200 determines whether all sectors pass erase verification. If one or more sectors fail the erase verification, then method 200 repeats the block erase operation but the negative gate bias is applied only to the word lines of sectors that failed the erase verification, as indicated by the sector pass/fail indicator for the sector address (214). The method 200 repeats at 208 to perform erase verification until all sectors in the block passed verification and the block erase operation is completed (216).

In the above described embodiments, a latch circuit is used as the pass/fail indicator state of the sector erase verify results. In some embodiments, latches, registers or other suitable storage circuits can be used to store the sector pass/fail indicator associated with a sector address.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A non-volatile memory device, comprising:
a two-dimensional array of non-volatile memory cells, the array of memory cells including at least a first block of memory cells formed in a first well region, the first block of memory cells being divided into two or more sectors of memory cells;
a row decoder comprising a row pre-decoder and a word line driver circuit, the row pre-decoder being configured to control a plurality of word lines corresponding to rows of the array of memory cells, the row pre-decoder being configured to activate one or more of the plurality of word lines in response to a row address, the word line driver configured to drive the one or more activated word lines to a first bias voltage level;
a first bias switch circuit configured to provide voltage pulses at the first bias voltage level to the word line driver circuit;
a second bias switch circuit configured to provide voltage pulses at a second bias voltage level to the first well region; and
a sector pass/fail indicator circuit configured to store a pass/fail indicator for each sector in the first block, the pass/fail indicator having a first value indicating the respective sector has failed erase verification and having a second value indicating the respective sector has passed erase verification, the pass/fail indicator values being provided to the row decoder,
wherein the sector pass/fail indicator circuit set the respective pass/fail indicators to the second value for one or more sectors in the first block after the respective sectors pass erase verification following a previous block erase operation of the first block, the first block being subjected to subsequent block erase operation where only word lines associated with the sectors having a pass/fail indicator having the first value are biased to the first bias voltage level.

2. The non-volatile memory device of claim 1, wherein the sector pass/fail indicator circuit resets the pass/fail indicators for all sectors of the first block of memory cells prior to the first block erase operation.

3. The non-volatile memory device of claim 1, wherein the first bias voltage level comprises a negative voltage level and the second bias voltage level comprises a positive voltage level.

4. The non-volatile memory device of claim 3, wherein the first well region comprises a P-type well region.

5. The non-volatile memory device of claim 1, wherein in response to the pass/fail indicator for a first sector in the first block having the second value, the row pre-decoder deactivates the word line associated with the first sector during the subsequent block erase operation of the first block.

6. The non-volatile memory device of claim 1, wherein the sector pass/fail indicator circuit comprises a plurality of latches, each latch being associated with a sector in the first block.

7. The non-volatile memory device of claim 1, wherein the sector pass/fail indicator circuit comprises a plurality of registers, each registers being associated with a sector in the first block.

8. A method of performing block erase operation on a non-volatile memory device, the non-volatile memory device comprising a two-dimensional array of non-volatile memory cells, the array of memory cells including at least one block of memory cells formed in a first well region, each block of memory cells being divided into two or more sectors of memory cells, the method comprising:

receiving an erase control signal and a block address indicating a block erase operation to be performed at the block address associated with a first block of memory;

resetting a set of sector pass/fail indicators associated with the two or more sectors of memory cells in the first block to a first value indicating the respective sector having failed erase verification, the sector pass/fail indicators having a second value indicating the respective sector having passed erase verification;

performing a block erase operation for the first block of memory cells associated with the block address including applying a first bias voltage to word lines associated with all of the sectors in the first block of memory cells;

performing an erase verification operation on the first block of memory cells;

setting the sector pass/fail indicator associated with a respective one of the sectors in the first block to the second value in response to the respective sector passing erase verification;

in response to at least one sector failing to pass erase verification, repeating the block erase operation for the first block of memory cells by applying the first bias voltage only to word lines associated with one or more sectors having associated sector pass/fail indicators having the first value.

9. The method of claim 8, further comprising:

applying a second bias voltage to the first well region, wherein the first bias voltage level comprises a negative voltage level and the second bias voltage level comprises a positive voltage level.

10. The method of claim 9, wherein the first well region comprises a P-type well region.

11. The method of claim 8, wherein repeating the block erase operation comprises:

repeating the block erase operation for the first block of memory cells by deactivating the word lines associated with one or more sectors having associated sector pass/fail indicators having the second value.

12. The method of claim 8, wherein setting the sector pass/fail indicator associated with a respective one of the sectors in the first block to the second value in response to the respective sector passing erase verification comprises:

setting a latch associated with the respective sector, the latch being set to the second value and being reset to the first value.

\* \* \* \* \*